United States Patent
Montez et al.

(10) Patent No.: US 9,550,664 B2
(45) Date of Patent: Jan. 24, 2017

(54) REDUCING MEMS STICTION BY INCREASING SURFACE ROUGHNESS

(71) Applicant: FREESCALE SEMICONDUCTOR, INC., Austin, TX (US)

(72) Inventors: Ruben B. Montez, Cedar Park, TX (US); Robert F. Steimle, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/574,784

(22) Filed: Dec. 18, 2014

(65) Prior Publication Data

US 2016/0176707 A1    Jun. 23, 2016

(51) Int. Cl.
*H01L 29/84* (2006.01)
*B81B 3/00* (2006.01)

(52) U.S. Cl.
CPC ........ *B81B 3/001* (2013.01); *B81B 2201/0235* (2013.01); *B81B 2203/0181* (2013.01); *B81C 2201/115* (2013.01)

(58) Field of Classification Search
CPC ............................ B81B 3/001; B81C 2201/115
USPC ........................................................ 257/415
See application file for complete search history.

(56) References Cited

U.S. PATENT DOCUMENTS

| 6,008,106 A | 12/1999 | Tu et al. |
| 7,303,936 B2 | 12/2007 | Chilcott |
| 2014/0167189 A1 | 6/2014 | Steimle et al. |

OTHER PUBLICATIONS

Maboudian, R., "Surface Processes in MEMS Technology", Surface Science Reports 30, www.cchem.berkeley.edu/rmgrp/Maboudian_surface_processes.pdf, 1998, pp. 209-268 (pp. 233-237 for texturing techniques).
U.S. Appl. No. 15/142,381, filed Apr. 29, 2016 entitled "Rough MEMS Surface".
de Boer, Marten P., "Surface Forces in MEMS—Adhesion and Friction Experiments", MEMS Technologies Dept., Sandia National Laboratories, Albuquerque, NM; Sep. 27-29, 2009.

*Primary Examiner* — Anthony Ho

(57) ABSTRACT

A mechanism for reducing stiction in a MEMS device by decreasing surface area between two surfaces, such as a travel stop and travel stop region, that can come into close contact is provided. Reduction in contact surface area is achieved by increasing surface roughness of the travel stop region. This is achieved by depositing a polysilicon layer over a dielectric layer using gaseous hydrochloric acid as one of the reactants. A subsequent etch back is performed to further increase the roughness. The deposition of polysilicon and subsequent etch back may be repeated one or more times in order to obtain the desired roughness. A final polysilicon layer may then be deposited to achieve a desired thickness. This final polysilicon layer is patterned to form the travel stop regions. The rougher surface decreases the surface area available for contact and, in turn, decreases the area through which stiction can be imparted.

20 Claims, 9 Drawing Sheets

REDUCING MEMS STICTION BY INCREASING SURFACE ROUGHNESS

BACKGROUND

Field

This disclosure relates generally to manufacture of microelectromechanical systems, and more specifically, to reducing stiction in MEMS devices by increasing surface roughness.

Related Art

Microelectromechanical systems (MEMS) devices are micromechanical devices that provide moving parts having features with dimensions below 100 μm. These moving parts are formed using micro-fabrication techniques. MEMS devices have holes, cavities, channels, cantilevers, membranes, and the like. These devices are typically based on silicon materials and use a variety of techniques to form the proper physical structures and to free the mechanical structures for movement.

Stiction is a static friction force that is a recurrent problem with typical MEMS devices. While any solid objects pressing against each other without sliding require some threshold of force (stiction) to overcome static cohesion, mechanisms generating this force are different for MEMS devices. When two surfaces with areas below the micrometer range come into close proximity, the surfaces may adhere together due to electrostatic and/or Van der Waals forces. Stiction forces at this scale can also be associated with hydrogen bonding or residual contamination on the surfaces.

For MEMS devices such as accelerometers, surfaces such as over-travel stops come into close proximity or contact during use at the limits of the device design. In those situations, stiction forces can cause the MEMS device parts (e.g., a teeter-totter accelerometer mechanism) to freeze in place and become unusable. Traditional methods of avoiding such close proximity travel or contact include increasing spring constants and increasing distance between parts of the MEMS device. But compensating for stiction in this manner can decrease sensitivity of the device, and therefore decrease the utility of the MEMS device. It is therefore desirable to provide a mechanism for reducing stiction-related interactions of MEMS devices without also decreasing sensitivity of the MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for reducing stiction in a MEMS device by decreasing surface area between two surfaces that can come into close contact. Reduction in surface area is achieved by increasing surface roughness of one or both of the surfaces, such as the travel stop region surface. Embodiments provide such increased roughness of the travel stop region surface by depositing a polysilicon layer over a dielectric layer using gaseous hydrochloric acid (HCl) as one of the reactants to result in a roughened surface of the polysilicon layer. A subsequent etch back is performed to further increase the roughness. The deposition of polysilicon and subsequent etch back may be repeated one or more times in order to obtain the desired roughness. A final polysilicon layer is deposited which maintains the roughness of the underlying polysilicon layer(s). The rougher surface of the travel stop region decreases the surface area available for contact in the MEMS device and, in turn, decreases the area on which stiction can be imparted.

Figure 1:
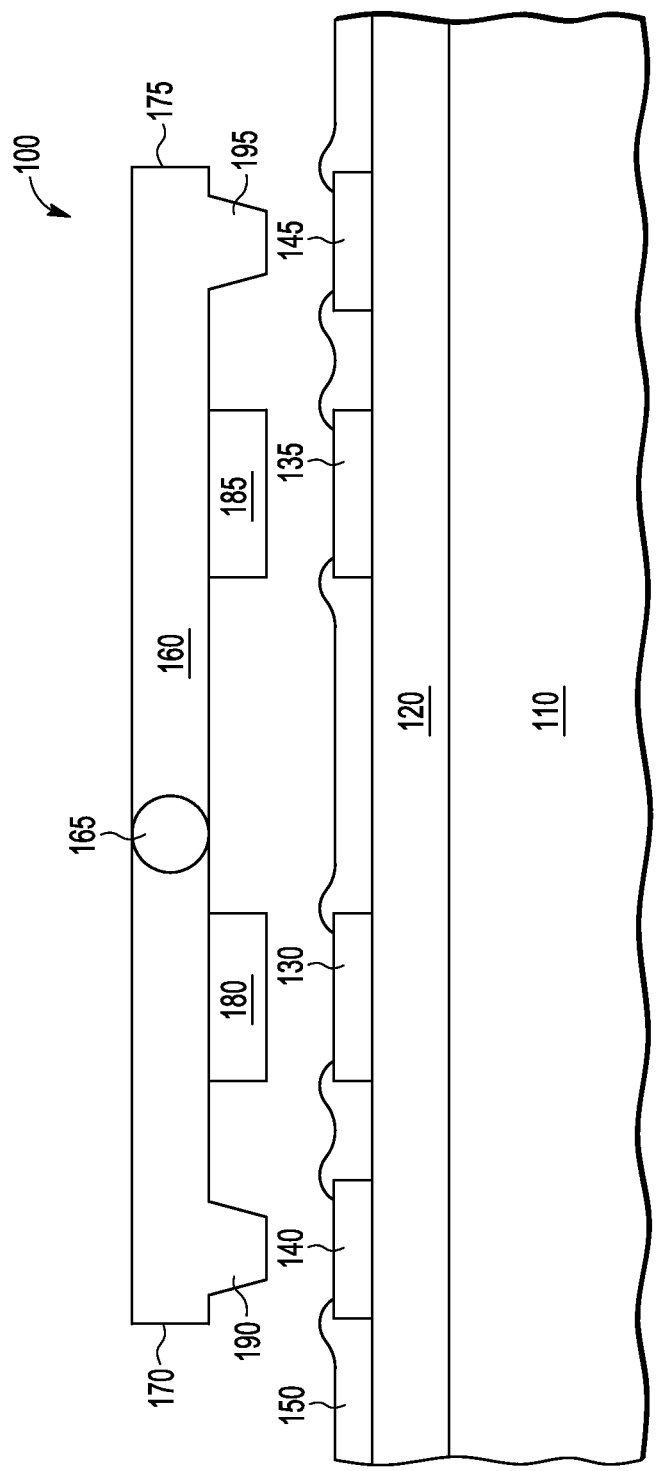
FIG. 1 is a simplified block diagram illustrating a cross section view of an accelerometer known in the prior art.

FIG. 1 is a simplified block diagram illustrating a cross section view of a teeter totter accelerometer as known in the art. Accelerometer 100 includes a substrate 110 with an insulating layer 120. Substrate 110 can be, for example, a silicon wafer and insulating layer 120 can be, for example, a silicon oxide or silicon nitride. In some cases, insulating layer 120 can be thermally grown from substrate 110 or the insulating layer can be deposited.

Fixed electrodes 130 and 135 are formed on top of insulating layer 120, along with travel stop regions 140 and 145. The layer forming fixed electrodes 130 and 135 and travel stop regions 140 and 145 is typically polysilicon and is formed using conventional techniques, including patterning the layer as desired for the application. The layer forming the fixed electrodes and travel stop regions can also be amorphous silicon, a metal-containing material, another suitable material, and the like, or any combination thereof. A dielectric layer 150 is formed to electrically isolate the electrodes and travel stop regions from other elements of the MEMS accelerometer. Dielectric layer 150 can be formed from a variety of materials, including, for example, silicon nitride, silicon dioxide, silicon oxynitride, and the like.

A pivoting proof mass 160 is suspended by a torsion bar spring and configured to move in a manner similar to that of a teeter totter upon acceleration. Pivoting proof mass 160 can be configured in a manner such that there is an imbalance between a side 170 of the pivoting proof mass and side 175 of the pivoting proof mass through pivot point 165. The amount of imbalance will have an effect of making the device more or less sensitive to acceleration. An electrode 180 configured on side 170 of the pivoting proof mass is associated with fixed electrode 130, while an electrode 185 on the pivoting proof mass is associated with fixed electrode 135. In addition, a travel stop 190 on side 170 of the pivoting proof mass is associated with travel stop region 140 and a travel stop 195 on side 175 of the pivoting proof mass is associated with travel stop region 145. Pivoting proof mass 160, including travel stops 190 and 195 are typically formed of polysilicon.

Electrode 180 and fixed electrode 130 form a first variable sense capacitor, while electrode 185 and fixed electrode 135 form a second variable sense capacitor. Changes in the capacitances of the first and second variable sense capacitors can be combined to provide a differential output from MEMS accelerometer 100.

Fabrication of the components of MEMS accelerometer 100 can be performed using known MEMS fabrication processes.

Figure 2:
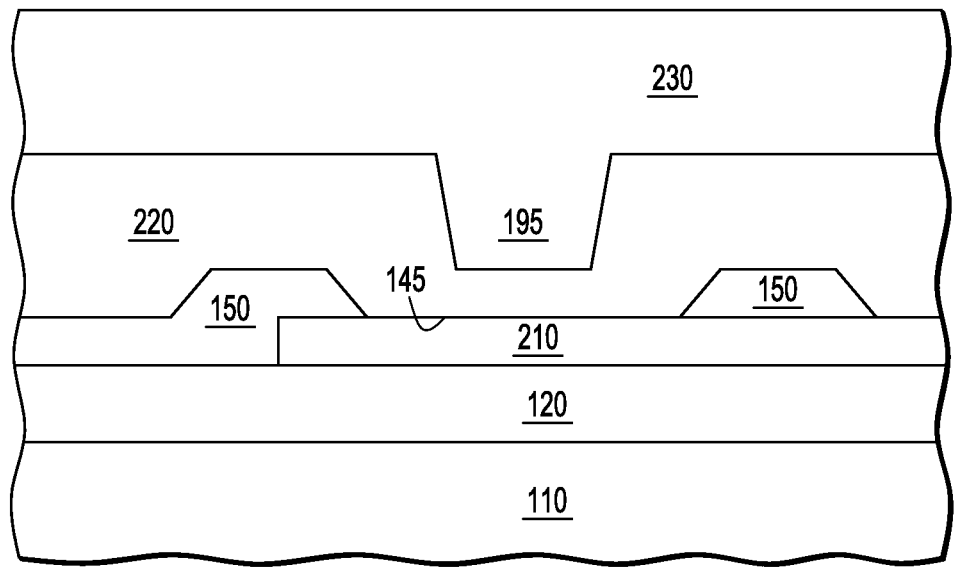
FIG. 2 is a simplified block diagram illustrating a close up of a cross section view of the travel stop region at an end of a MEMS accelerometer during a stage of fabrication.

FIG. 2 is a simplified block diagram illustrating a close up of a cross section view of the travel stop region at end 175 of MEMS accelerometer 100 during a stage of fabrication. As discussed above, a substrate 110 is provided with insulating layer 120, where substrate 110 can be a silicon wafer and insulating layer 120 can be a silicon oxide. A first polysilicon layer 210 is formed on insulating layer 120, forming, in part, travel stop region 145. Dielectric layer 150 is formed over insulating layer 120 and polysilicon layer 210, in order to, for example, prevent excessive etching of insulating layer 120. A sacrificial layer 220 is formed on top of patterned dielectric layer 150 and exposed regions of polysilicon layer 210. Sacrificial layer 220 is commonly formed using tetraethyl orthosilicate (TEOS) gas to form a sacrificial layer of silicon oxide or the sacrificial layer can be formed of phosphosilicate glass (PSG). The sacrificial layer can be patterned to form a "mold" for the next layer of the MEMS device. A second polysilicon layer 230 can be formed on the patterned sacrificial layer to form pivoting proof mass 160, including travel stop 195. The buildup of patterned layers can continue as needed for the application.

Figure 3:
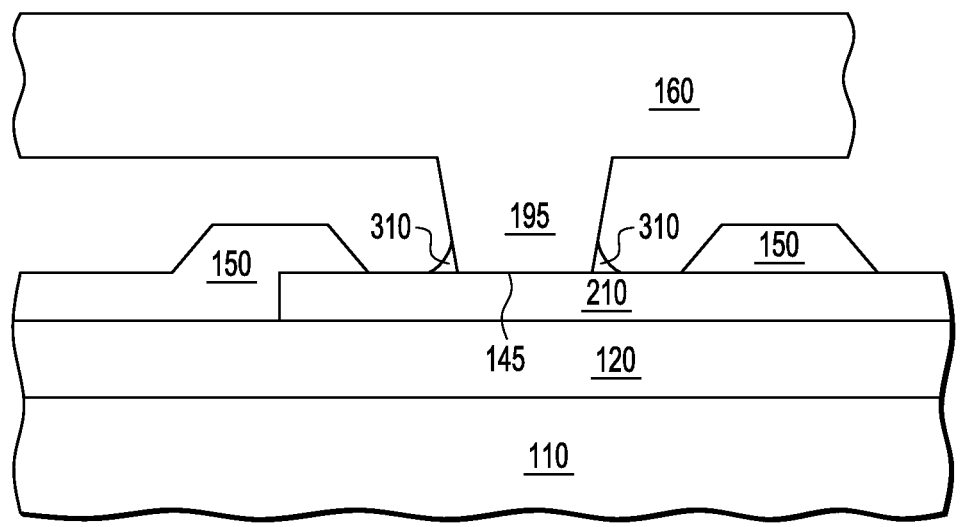
FIG. 3 is a simplified block diagram illustrating a cross-section view of the travel stop region during a stage of fabrication subsequent to that of FIG. 2.

FIG. 3 is a simplified block diagram illustrating a cross-section view of the travel stop region during a stage of fabrication subsequent to that of FIG. 2. Sacrificial layer 220 is commonly removed using an isotropic wet etch process selective to the sacrificial layer. Such an etch is performed by either a vapor or a liquid phase process. But capillary forces due to surface tension of the liquid used for the etching process or liquid byproducts of the etch process, between travel stop 195 and polysilicon travel stop region 145, as illustrated by meniscus 310, can cause the surfaces to adhere together during drying. Separating the two surfaces is complicated due to the fragile nature of the microstructure. Use of travel stops helps to minimize contact between surfaces in a MEMS device, which can help to reduce adhesion during drying. But this does not necessarily eliminate the problem, as the surface of the travel stop is subject to stiction as well.

Figure 4:
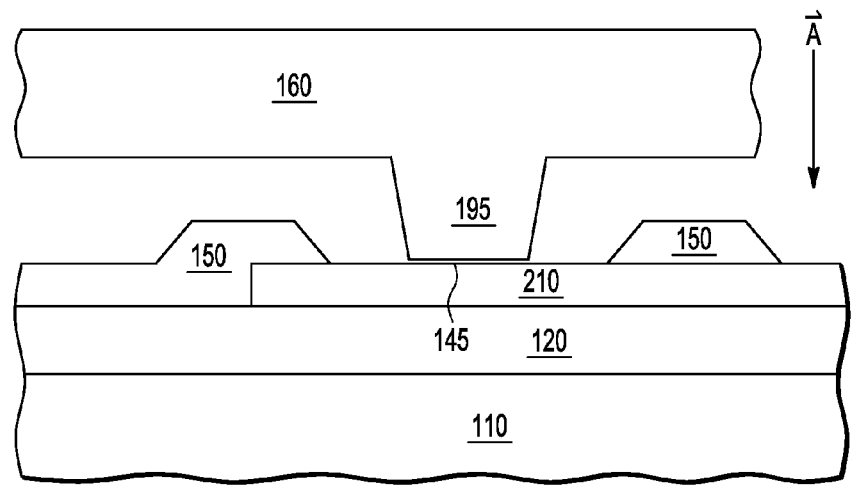
FIG. 4 is a simplified block diagram illustrating a cross-section view of the travel stop region during use of the accelerometer.

FIG. 4 is a simplified block diagram illustrating a cross-section view of the travel stop region during a use of the accelerometer. Acceleration A on pivoting proof mass 160 is sufficient to exceed the design specification for the accelerometer. This causes travel stop 195 to impact travel stop region 145, thereby preventing contact of electrode 185 to fixed electrode 135. In this case, however, stiction forces such as Van der Waals, electrostatic, and/or hydrogen bonding can cause the travel stop surface to stick to the travel stop region. It is desirable to prevent stiction in both the scenarios illustrated in FIG. 3 and FIG. 4.

Embodiments of the present invention provide a mechanism by which the surface area of travel stop 195 that can come in contact with travel stop region 145 is reduced. As discussed above, the reduced surface area decreases the magnitude of the stiction forces. This is accomplished by forming travel stop regions 140 and 145 having a surface roughness sufficient to reduce stiction between the travel stops and the travel stop regions.

Figure 5:
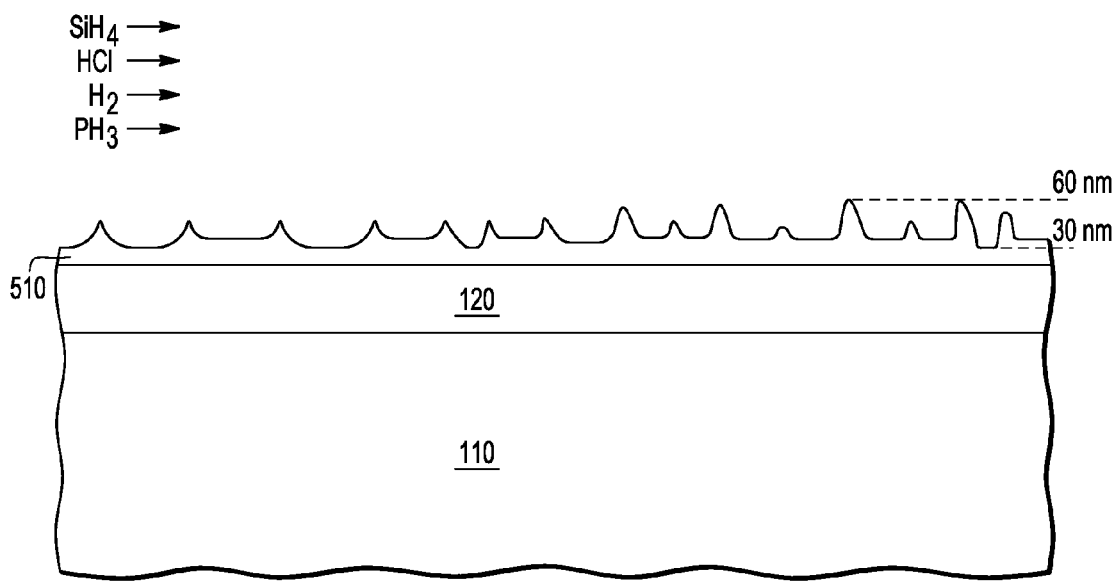
FIG. 5 is a simplified block diagram illustrating a cross-section view of the travel stop region during a stage of fabrication performed in accord with embodiments of the present invention.

FIG. 5 is a simplified block diagram illustrating a cross-section view of the area in which travel stop region 145 will be formed, during a stage of fabrication performed in accord with embodiments of the present invention. As described above with regard to FIG. 2, an insulating layer 120 is formed over substrate 110, in which insulating layer can be, for example, a silicon oxide or silicon nitride. A polysilicon layer 510 is formed directly on insulating layer 120. Polysilicon layer 510 is formed by deposition by reacting a silicon (Si) containing gas, gaseous HCl, hydrogen ($H_2$), and a dopant gas for a first duration of time at a first temperature. In one embodiment, the dopant gas is phosphine ($PH_3$) such that resulting layer 510 is a polysilicon layer doped with phosphorous. Alternate embodiments may use different dopant gases, such as arsine, or no dopant gas at all. In one embodiment, the Si-containing gas may be silane. During the deposition, the silane and hydrogen react via pyrolytic decomposition to form silicon. The resultant silicon locally agglomerates on the surface of insulating layer 120 in the form of polysilicon. The addition of HCl to the silane and hydrogen gases decreases the polysilicon growth rate and facilitates locally non-uniform surface polysilicon deposition on the surface of insulating layer 120, thus increasing surface roughness of the resulting polysilicon layer, such as polysilicon layer 510. A dopant gas can be added to lower the electrical resistance of the resulting polysilicon layer. In alternate embodiments, the Si-containing gas may be any type of silane (e.g. $SiH_4$, $Si_2H_6$) or chlorinated silane (e.g. $SiH_2Cl_2$, $SiCl_4$, $HSiCl_3$). In one embodiment, the Si-containing gas is a methyl silane ($SiH_3CH_3$) which results in depositing a polysilicon carbide layer.

In one embodiment, the deposition is preformed at a temperature of at least 630 degrees Celsius, such as at about 650 degrees Celsius, for a duration of 5 to 15 minutes. By keeping the temperature at 630 degrees Celsius or greater, the resulting deposited polysilicon layer is ensured to stay in the polysilicon phase while a lesser temperature may result in a mixed phase of polysilicon between polysilicon and amorphous silicon. Due to the ratio of the Si-containing gas (e.g. $SiH_4$) and HCl, resulting layer 510 has a roughness characterized by peaks and valleys of the surface. In one embodiment, the flow of HCl during the deposition is 70 standard cubic centimeters per minute (sccm) and the flow of $SiH_4$ is 290 sccm. This provides a ratio of HCl to $SiH_4$ of 1 to 4.1. That is, HCl is about 19.4% of the total flow of the HCl and $SiH_4$. In another embodiment, the flow of HCl during the deposition is 85 sccm and the flow of $SiH_4$ is 290 sccm, which provides a ratio of HCl to $SiH_4$ of 1 to 3.4. That is, HCl is about 22.7% of the total flow of the HCl and $SiH_4$. In yet another embodiment, the flow of HCl during the deposition is 55 sccm and the flow of $SiH_4$ is 290 sccm, which provides a ratio of HCl to $SiH_4$ of 1 to 5.3. That is, HCl is about 15.9% of the total flow of the HCl and $SiH_4$. Therefore, in order to achieve the desired surface roughness during the deposition of the polysilicon, the percentage of HCl of the total flow of HCl and the silicon-containing gas may be at least 15%, or alternatively, at least 18 percent, or alternatively at least 20%, or alternatively, at least 22%. The percentage of HCl of the total flow of HCl and the silicon-containing gas may be in a range of 15% to 23%, or alternatively, 16% to 22%, or alternatively, 18% to 21%.

Still referring to the deposition of layer 510, the ratio between the silicon (Si) source and the $H_2$ and HCl gases determines the thickness and resulting roughness of polysilicon layer 510. In one embodiment, the flow of $H_2$ during the deposition is 35 standard liters per minute (slm). In one embodiment, a mean thickness of layer 510 is 40 nm, having a tallest peak of at least 55 nm (e.g., about 60 nm) and a lowest valley of at most 35 nm (e.g., about 30 nm), as measured from the top surface of insulating layer 120. In one embodiment, the difference between the tallest peak and lowest valley is in a range of 20 to 30 nm.

Figure 6:
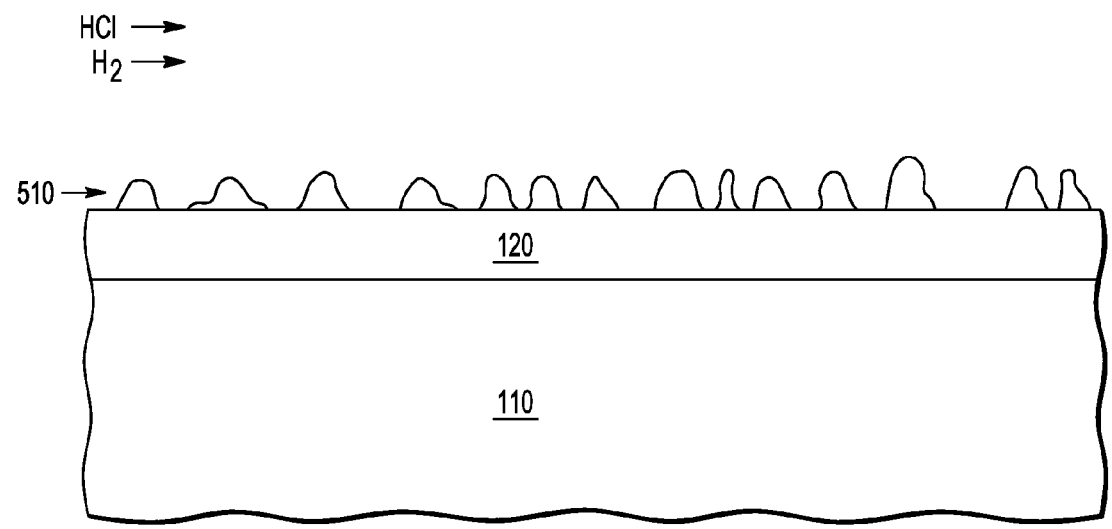
FIG. 6 is a simplified block diagram illustrating a cross-section view of the travel stop region during a stage of fabrication subsequent to that illustrated in FIG. 5.

FIG. 6 is a simplified block diagram illustrating a cross-section view at a subsequent stage of fabrication. After the deposition illustrated in FIG. 5, while the device remains in the same chamber, the temperature is raised to a second temperature and an etch back is performed using HCl and $H_2$ at a temperature of at least 950 degrees Celsius for a second duration of time. The temperature for the etch back is greater than the temperature of the previous deposition. In one embodiment, the etch back is performed at the second temperature for 10-40 seconds. Also, the flow of $H_2$ during etch back may be 35 slm and the flow of HCl may be 200 sccm. During the etch back, layer 510 is further roughened by removing some of the polysilicon. Therefore, portions of insulating layer 120 may be exposed between raised portions of polysilicon layer 510 and the peaks are reduced in height.

Figure 7:
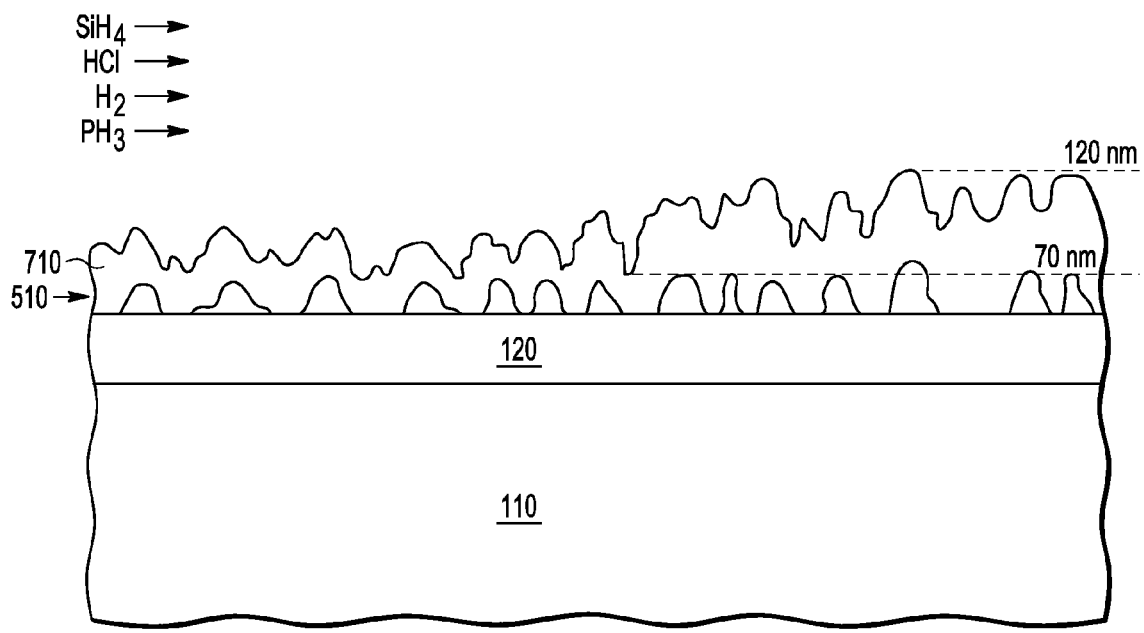
FIG. 7 is a simplified block diagram illustrating a cross-section view of the travel stop region during a stage of fabrication subsequent to that illustrated in FIG. 6.

FIG. 7 is a simplified block diagram illustrating a cross-section view at a subsequent stage of fabrication. The deposition, as described above in reference to FIG. 5, and the etch back, as described in reference to FIG. 6 are repeated. Therefore, in the fabrication stage of FIG. 7, a subsequent deposition is performed at the first temperature for the first duration of time by reacting the Si-containing gas, HCl, $H_2$, and the dopant gas, resulting in a polysilicon layer 710 formed on polysilicon layer 510. The descriptions, parameters, and alternatives described for the first deposition to form polysilicon layer 510 described in reference to FIG. 5 apply to the subsequent deposition of FIG. 7. After the subsequent deposition, a mean thickness of layer 510 in combination with layer 710 is 60 nm, having a tallest peak of about 120 nm and a lowest valley of about 70 nm, as measured from the top surface of insulating layer 120. In one embodiment, the difference between the tallest peak and lowest valley is in a range of 40 to 60 nm.

Figure 8:
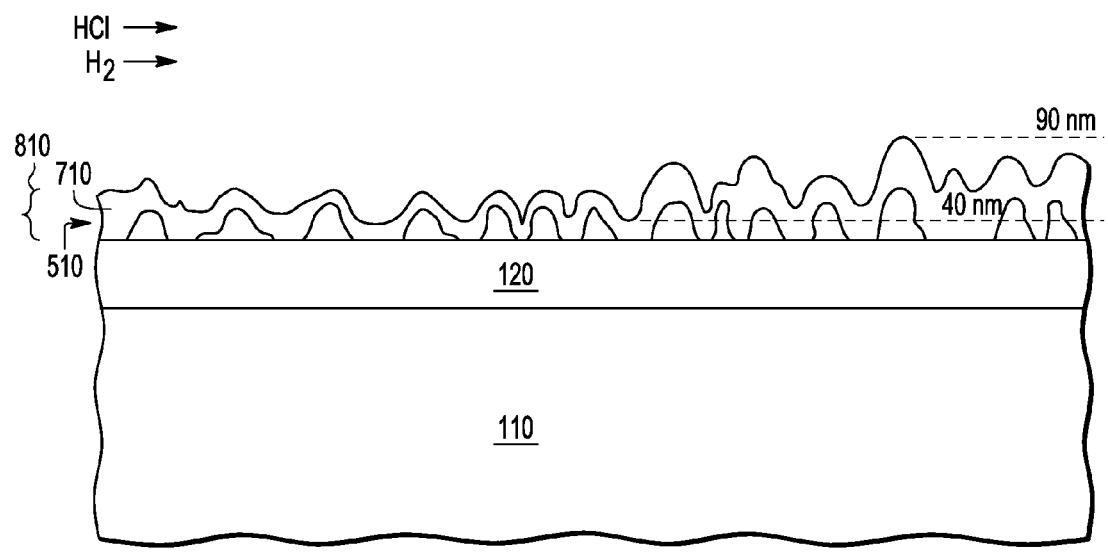
FIG. 8 is a simplified block diagram illustrating a cross-section view of the travel stop region during a stage of fabrication subsequent to that illustrated in FIG. 7.

FIG. 8 is a simplified block diagram illustrating a cross-section view at a subsequent stage of fabrication. In this stage, a subsequent etch back is performed at the second temperature for the second duration of time by using HCl and $H_2$, thus resulting in polysilicon layer 810, which refers to the combination of polysilicon layers 510 and 710. The descriptions, parameters, and alternatives described for the first etch back described with respect to FIG. 6 apply to the etch back of FIG. 8. After the subsequent etch back, a mean thickness of layer 810 is 60 nm, having a tallest peak of about 90 nm and a lowest valley of about 40 nm, as measured from the top surface of insulating layer 120. In one embodiment, the difference between the tallest peak and lowest valley is in a range of 40 to 70 nm.

Figure 9:
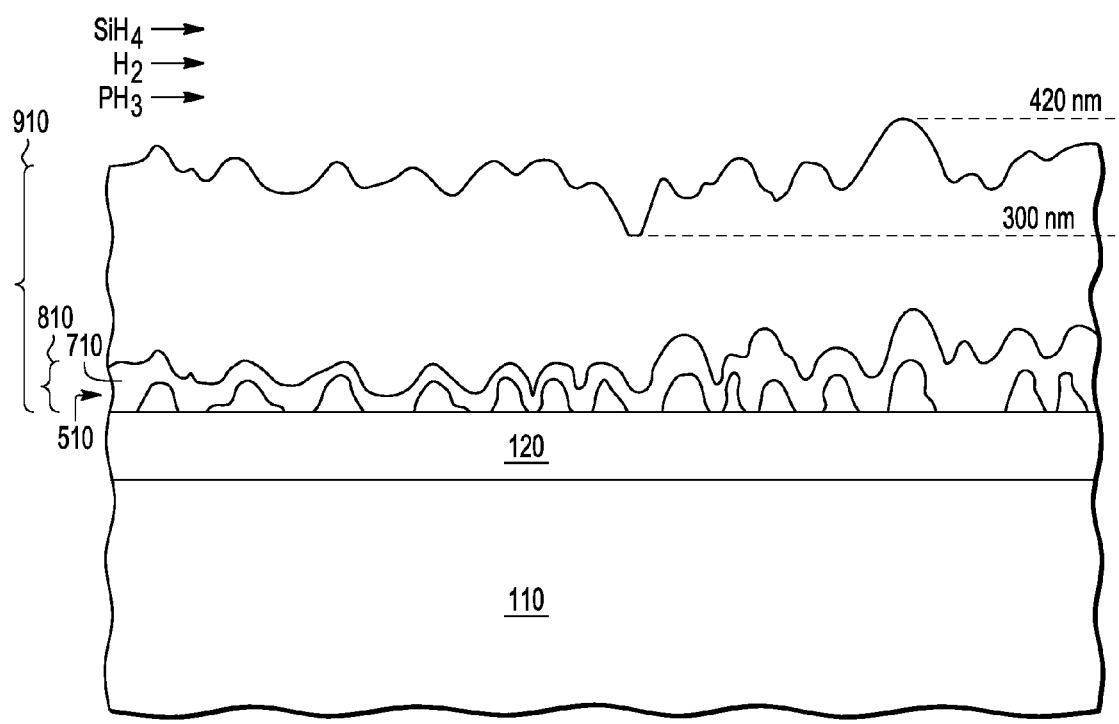
FIG. 9 is a simplified block diagram illustrating a cross-section view of the travel stop region during a stage of fabrication subsequent to that illustrated in FIG. 8.

FIG. 9 is a simplified block diagram illustrating a cross-section view at a subsequent stage of fabrication. A final polysilicon layer 910 is deposited over layer 810 in order to achieve a desired overall thickness of resulting polysilicon layer 920, which refers to the combination of layers 510, 710, and 910. Layer 910 is deposited by reacting the Si-containing gas, H2, and the dopant gas at a third temperature for a third duration. In one embodiment, the deposition is performed at a temperature in range of about 650 degrees Celsius to 750 degrees Celsius. The alternatives described for the Si-containing gas described above in reference to FIG. 5 also apply to the deposition described in reference to FIG. 9. Note that the deposition of layer 910 is performed without HCl as a reactant. In this manner, layer 910 is formed smoothly and can be formed to a greater thickness. However, layer 910 conforms with underlying polysilicon layer 810 thus exhibiting the roughness of the surface of underlying layer 810. In one embodiment, a mean thickness of layer 910 is in a range of 330 to 370 nm, such as, for example, 350 nm, and has a tallest peak of about 420 nm and a lowest valley of about 300 nm, as measured from the top surface of insulating layer 120. In one embodiment, the difference between the tallest peak and lowest valley is in a range of 70 to 120 nm.

In the illustrated embodiment of FIGS. 5-8, the deposition and etch back is performed twice, prior to depositing final polysilicon layer 910. In one embodiment, the deposition and etch back is not repeated in which processing after FIG. 6 proceeds to the final deposition as described in reference to FIG. 9. In alternate embodiments, the deposition and etch back is performed more than twice, such as three times, in order to achieve the desired roughness of the resulting polysilicon layer 920. In one embodiment, all depositions and etch backs, along with the final deposition, are performed in the same chamber.

Figure 10:
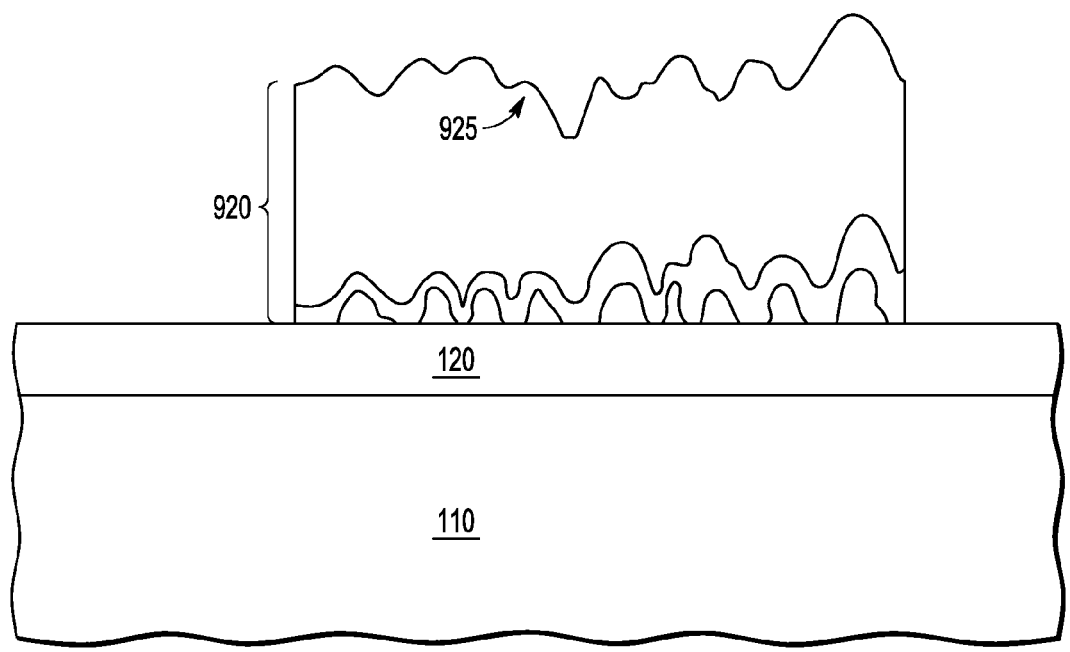
FIG. 10 is a simplified block diagram illustrating a cross-section view of the travel stop region during a stage of fabrication subsequent to that illustrated in FIG. 9.

FIG. 10 is a simplified block diagram illustrating a cross-section view at a subsequent stage of fabrication. Polysilicon layer 920 is patterned to result in travel stop regions, such as travel stop region 925, with rough top surfaces. Each travel stop region may have the same mean thickness as polysilicon layer 920 with the a tallest peak of at least 400 nm (e.g., about 420 nm) and a lowest valley of at most 320 nm (e.g. about 300 nm). Therefore, travel stop region 925 formed as described in reference to FIGS. 5-10 have a rougher surface than travel stop regions 140 and 145 described above in reference to FIGS. 2-4.

Figure 11:
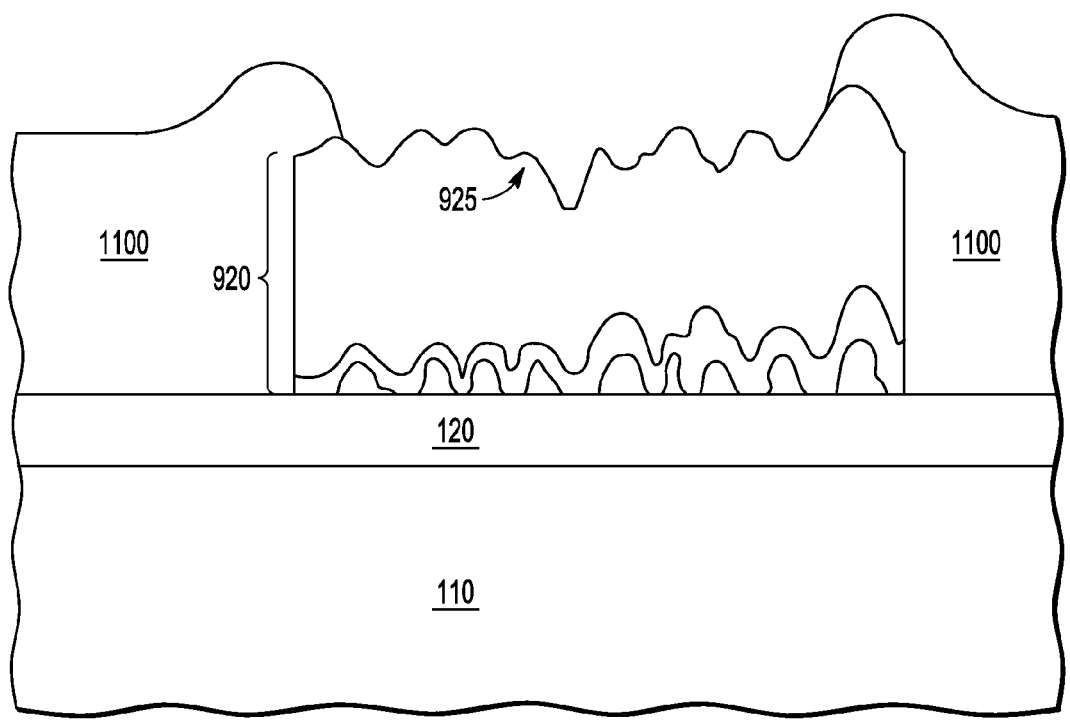
FIG. 11 is a simplified block diagram illustrating a cross-section view of the travel stop region during a stage of fabrication subsequent to that illustrated in FIG. 10.

FIG. 11 is a simplified block diagram illustrating a cross-section view at a subsequent stage of fabrication. A dielectric 1100 layer is formed over insulating layer 120 and openings are formed in dielectric layer 110 to expose the travel stop regions, such as travel stop region 925.

Figure 12:
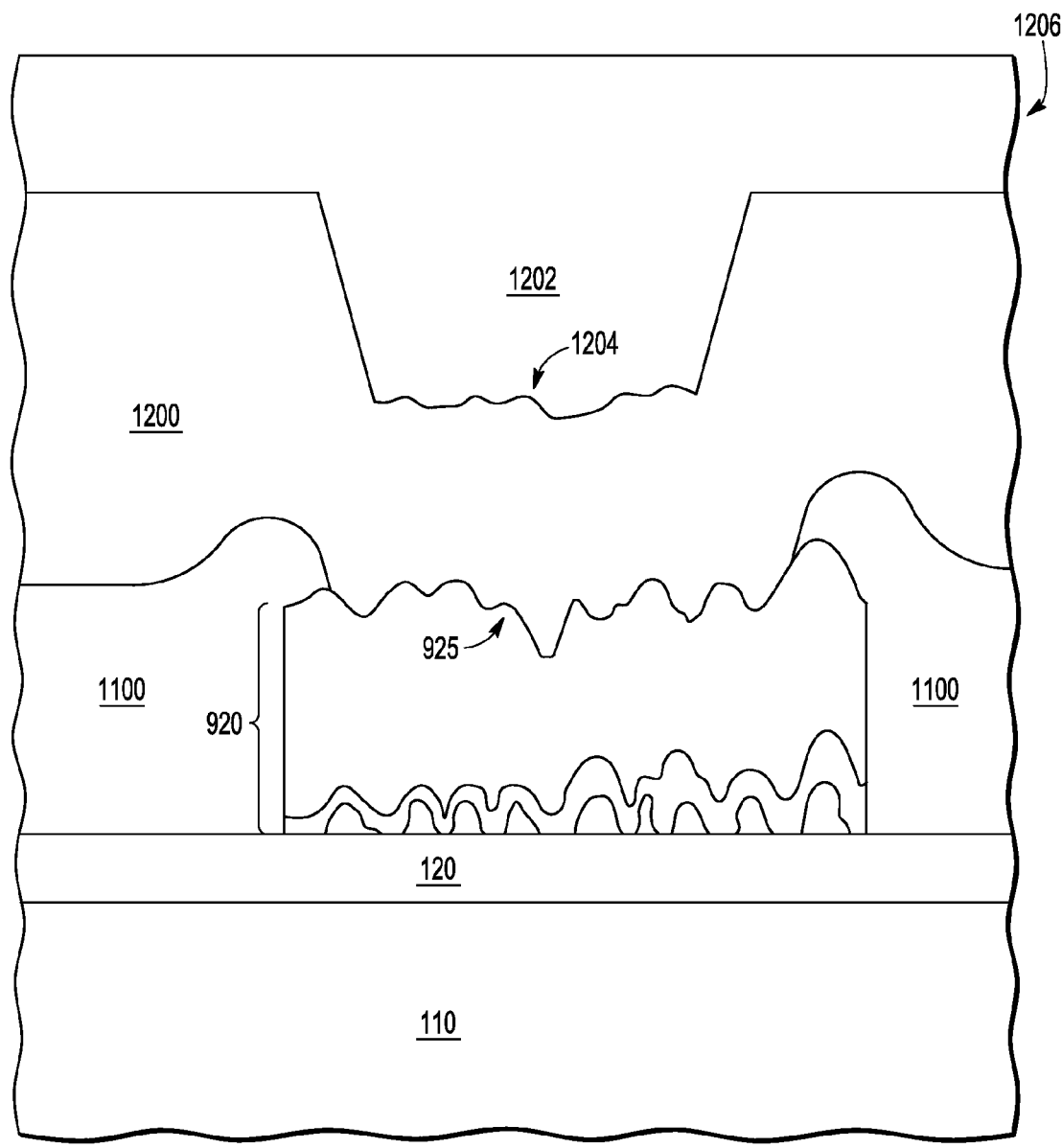
FIG. 12 is a simplified block diagram illustrating a cross-section view of the travel stop region during a stage of fabrication subsequent to that illustrated in FIG. 11.

FIG. 12 is a simplified block diagram illustrating a cross-section view at a subsequent stage of fabrication in which a sacrificial layer 1200, similar to sacrificial layer 220 described above, is form over patterned dielectric layer 1100 and exposed regions of rough polysilicon layer 920. Sacrificial layer 1200 may be formed using TEOS gas to form a sacrificial layer of silicon oxide or the sacrificial layer can be formed of phosphosilicate glass (PSG). Sacrificial layer 1200 is then patterned to form a "mold" for the next layer of MEMS device, a polysilicon layer 1202. Polysilicon layer 1202 is formed over patterned sacrificial layer 1200 to form pivoting proof mass 1206, including travel stop 1204. Pivoting proof mass 1206 is similar to pivoting proof mass 160. Since sacrificial layer 1200 is formed over patterned polysilicon layer 925, sacrificial layer 1202 which corresponds to the locations of the travel stops may also exhibit some surface roughness. Therefore, resulting travel stop 1204 of polysilicon layer 1202 may have more roughness as compared to travel stop 195.

Figure 13:
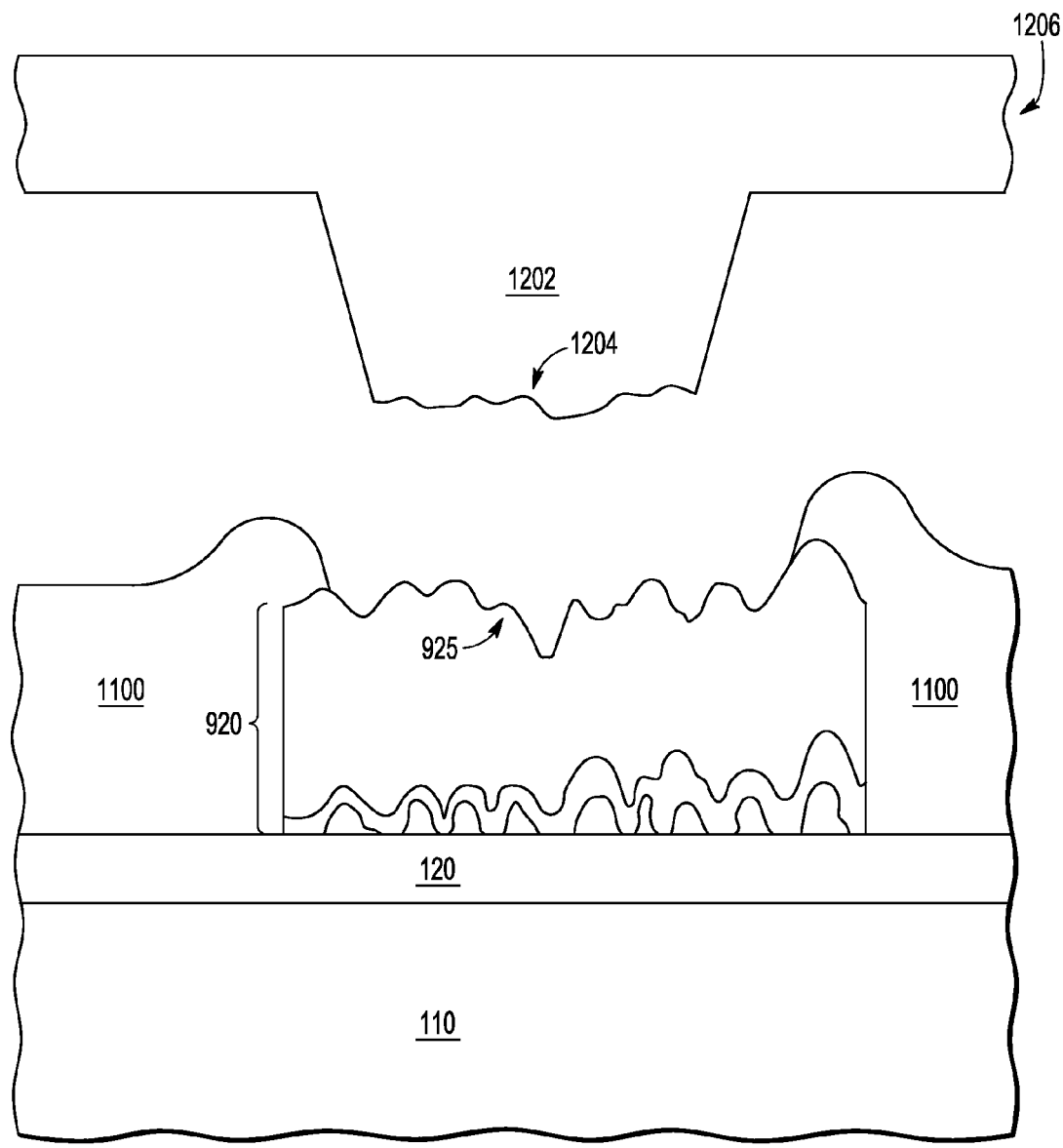
FIG. 13 is a simplified block diagram illustrating a cross-section view of the travel stop region subsequent to removal of a sacrificial layer, where the travel stop is formed in accord with embodiments of the present invention.

FIG. 13 is a simplified block diagram illustrating a cross-section view at a subsequent stage of fabrication in which sacrificial layer 1200 is removed to separate travel stop 1204 and travel stop region 925. The removal of sacrificial layer 1200 frees the movable portion, e.g. pivoting proof mass 1206, of the MEMS device. Sacrificial layer 1200 may be removed using an isotropic wet etch process, which may be performed by either a vapor or a liquid phase process. Due to the decreased surface area of the travel stop that comes in contact with the travel stop region, travel stop 1204 of pivoting proof mass 1206 and travel stop region 925 are much less likely to adhere together during drying after the etch process.

Figure 14:
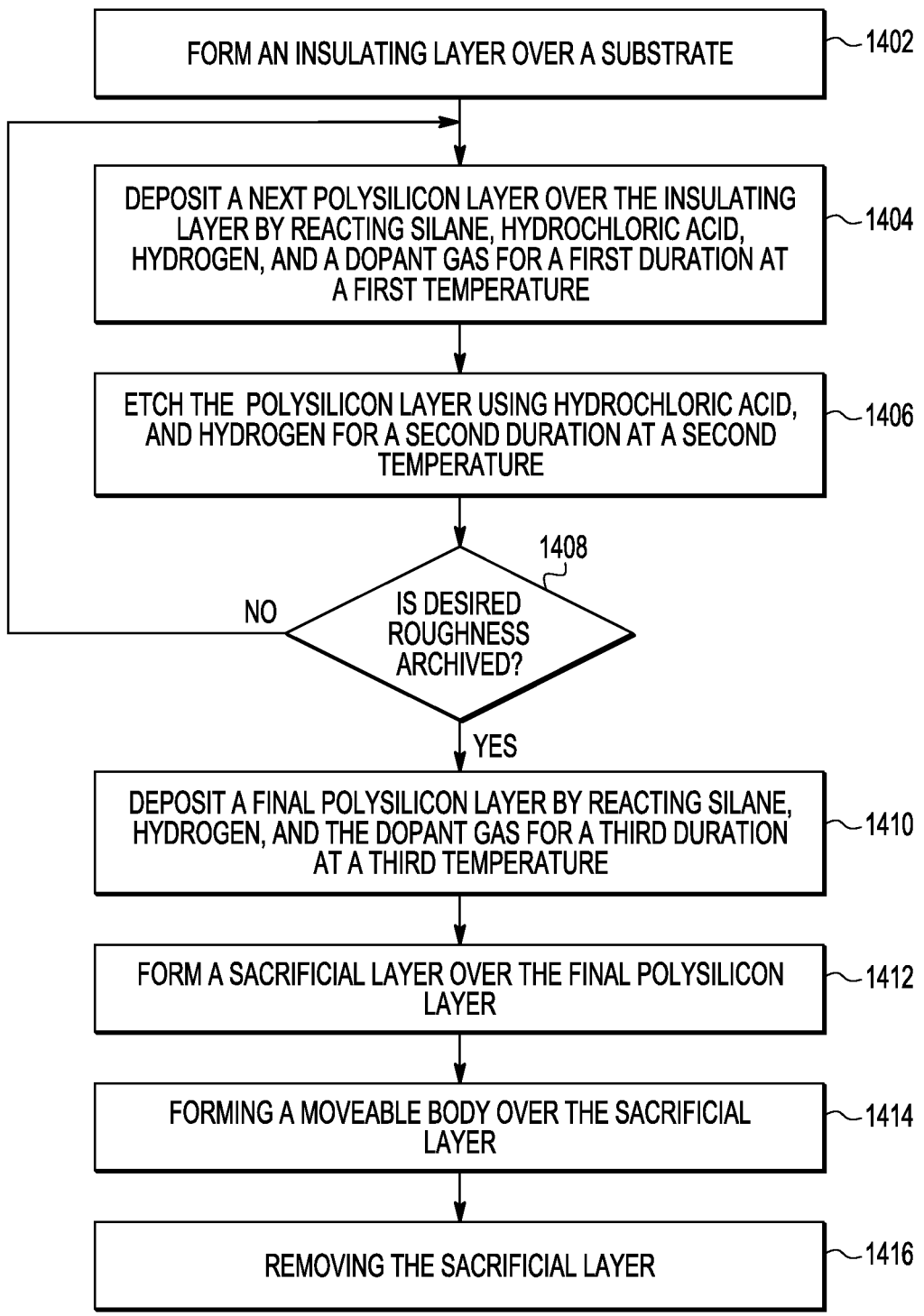
FIG. 14 is a flow diagram illustrating a method of forming the travel stop region in accord with embodiments of the present invention.

FIG. 14 illustrates, in flow diagram form, a method 1400 of forming a travel stop region with a rough surface, in accordance with one embodiment of the present invention. Method 1400 begins with block 1402 in which an insulating layer is formed over a substrate, such as insulating layer 120 over substrate 110 described above. Method 1400 proceeds to block 1404 in which a next polysilicon layer is deposited over the insulating layer by reacting silane, gaseous hydrochloric acid, hydrogen, and a dopant gas for a first duration at a first temperature, such as was described above in reference to FIG. 5. This results in the deposited polysilicon layer having a rough surface, thus decreasing surface area of the top surface. Note that the dopant gas may or may not be present. Method 1400 proceeds to block 1406 in which the deposited polysilicon layer is etched using gaseous hydrochloric acid and hydrogen for a second duration at a second temperature, such as was described above in reference to FIG. 6. This results in further roughening the surface of the deposited polysilicon layer. Method 1400 proceeds to decision diamond 1408 where it is determined if a desired roughness of the deposited polysilicon layer has been achieved. If not, method 1400 returns to block 1404 in which a next polysilicon layer is deposited by reacting silane, gaseous hydrochloric acid, hydrogen, and the dopant gas for the first duration at the first temperature, such as was described above in reference to FIG. 7. Method 1400 continues to block 1406 in which an etch is again performed using gaseous hydrochloric acid and hydrogen for the second duration at the second temperature. This second iteration of blocks 1404 and 1406 further increases the roughness of the polysilicon layer. As was described above, this process of depositing polysilicon by reacting silane, gaseous hydrochloric acid, and hydrogen followed by etching the deposited polysilicon using gaseous hydrochloric acid and hydrogen may be repeated, as needed, to result in a desired surface roughness of the polysilicon layer. Therefore, at decision diamond 1408, if the desired roughness is achieved, method 1400 proceeds to block 1410.

In block 1410, a final layer of polysilicon is deposited by reacting silane, hydrogen, and the dopant gas (if present) for a third duration at a third temperature, such as was described above in reference to FIG. 9. Due to the roughness of the underlying polysilicon layer formed with the process of blocks 1404 and 1406, the surface of the resulting final layer of polysilicon also exhibits the desired roughness. After depositing the final polysilicon layer, it may be patterned to define travel stop regions, such as travel stop region 145. Subsequently, a dielectric layer may be formed having openings which expose the travel stop regions. Method 1400 then proceeds to block 1412 in which a sacrificial layer is formed over the final polysilicon layer, such as was described above in reference to FIG. 12. Method 1400 proceeds to block 1414 in which a moveable body is formed over the sacrificial layer. For example, a polysilicon layer may be formed over the sacrificial layer, such as polysilicon layer 1202, which forms the moveable body, such as pivoting proof mass 160. After block 1416, method 1400 proceeds to block 1416 in which the sacrificial layer is removed, such as was described above in reference to FIG. 13.

While the above embodiments have been described in reference to polysilicon travel stop regions, alternate embodiments may use other semiconductor materials to form travel stop regions with a rough surface. For example, germanium may be deposited by reacting a germanium-containing gas (such as germane ($GeH_4$)), HCl, and $H_2$. Furthermore, a dopant gas may be included during the deposition. This results in a germanium layer with a rough surface as was described above with respect to polysilicon layers 510 and 710. Subsequent to the deposition, an etch back is performed using HCl and $H_2$ to further increase the roughness. The same temperature ranges, ratios, and time durations provided above for the formation of polysilicon layer 920 may be used for the formation of a germanium layer which may be patterned to form travel stop region 925.

Using the process described above, travel stop region 925 has a rough surface which decreases contact surface area with travel stop 1204. In a situation in which travel stop 1204 comes in contact with travel stop region 925, contact surface area is reduced as compared to a smooth travel stop region. This reduction in surface area decreases the chance for stiction by both wet stiction and electrostatic/Van der Waals type forces.

One advantage of reducing the chances for stiction to occur in accelerometer-type MEMS devices is improved sensitivity of the device. In one type of traditional MEMS accelerometer, stiction force is countered by increasing a spring constant of the device. But increasing the spring constant decreases sensitivity of the MEMS device to light acceleration forces. In another type of traditional MEMS device, chances for stiction occurring are sought to be reduced by increasing the distance between the movable portions of the device and the fixed portions of the device. But this increases the distance between the capacitive plates and can therefore decrease differences in measured capacitance. Reducing stiction forces by using embodiments of the present invention allow for lower spring constants and smaller distances between parts, both of which can improve device sensitivity. Further, smaller overall device sizes can be realized by decreasing the distances between the parts. This can, in turn, provide a decreased footprint for each MEMS device, thereby allowing for incorporation of more MEMS devices in a system or a smaller system size.

By now it should be appreciated that there has been provided a method for manufacturing a micro electromechanical systems device with a roughened travel stop region. The roughness of the travel stop region surface may be achieved by depositing a polysilicon layer over a dielectric layer using gaseous HCl as one of the reactants. A subsequent etch back is performed to further increase the roughness. The deposition of polysilicon and subsequent etch back may be repeated one or more times in order to obtain the desired roughness. A final polysilicon layer may then me deposited to achieve a desired thickness of the travel stop region whose surface roughness corresponds to the surface roughness of the underlying one or more polysilicon layers. This final polysilicon layer is then patterned to form the travel stop regions of the MEMs device. With these rough travel stop regions, the surface areas between the travel stop and travel stops regions on which stiction may be imparted is reduced, thus resulting in improved MEMs devices.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the description of embodiments of the invention relates to a teeter-totter type accelerometer. Embodiments of the present invention are not limited to teeter-totter accelerometers, but can include accelerometers having a mass suspended by springs, or other MEMS devices that have a potential for components to come in contact with one another during operation or manufacture. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

In one embodiment, a method for manufacturing a microelectromechanical systems (MEMS) device includes forming an insulating layer over a substrate; depositing a first polysilicon layer on the insulating layer by reacting a silicon-containing gas, gaseous hydrochloric acid, and hydrogen for a first duration of time at a first temperature, wherein, during the deposition, the gaseous hydrochloric acid is at least 15% of a total flow of the gaseous hydrochloric acid and the silicon-containing gas; etching the first polysilicon layer using gaseous hydrochloric acid and hydrogen for a second duration of time at a second temperature; depositing a second polysilicon layer over the etched first polysilicon layer by reacting the silicon-containing gas and hydrogen for a third duration of time at a third temperature; and patterning the second polysilicon layer and the first polysilicon layer to form a travel stop region of the MEMS device. In one aspect, the method further includes forming a sacrificial layer over the travel stop region; and forming a third polysilicon layer on the sacrificial layer. In a further aspect, the method further includes removing the sacrificial layer to separate the third polysilicon layer from the travel stop region. In another aspect, after the etching the first polysilicon layer and prior to depositing the second polysilicon layer, the method further includes depositing a third polysilicon layer on the etched first polysilicon layer by reacting the silicon-containing gas, gaseous hydrochloric acid, and hydrogen for a fourth duration of time at a fourth temperature, wherein, during the deposition of the third polysilicon layer, the gaseous hydrochloric acid is at least 15% of a total flow of the gaseous hydrochloric acid and the silicon-containing gas; and etching the third polysilicon layer using gaseous hydrochloric acid and hydrogen for a fifth duration of time at a fifth temperature, wherein the second polysilicon layer is deposited over the etched third polysilicon layer. In a further aspect, the first duration of time and fourth duration of time is each in a range of 5 to 15 minutes and wherein the first temperature and the fifth temperature is each at least 630 degrees Celsius. In another further aspect, the depositing the third polysilicon layer is performed by also reacting a dopant gas. In yet another aspect, the first duration of time is in a range of 5 to 15 minutes and wherein the first temperature is at least 630 degrees Celsius. In a further aspect, the depositing the first polysilicon layer is performed by also reacting a dopant gas. In another further aspect, the second duration of time is in a range of 10 to 40 seconds and the second temperature is at least 950 degrees Celsius. In yet another aspect, the deposited first polysilicon layer has a mean thickness of 40 nm with a tallest peak of at least 55 nm and a lowest valley of at most 35 nm. In a further aspect, the travel stop region has a mean thickness of 350 nm with a tallest peak of at least 420 nm and a lowest valley of at most 300 nm.

In another embodiment, a microelectromechanical systems (MEMS) device includes a fixed surface including a first semiconductor layer formed over a substrate, wherein the first semiconductor layer has a mean thickness of 350 nm with a tallest peak of at least 420 nm and a lowest valley of at most 300 nm; and a first insulating layer formed over at least a portion of the first semiconductor layer. The device also includes a movable body including a second semiconductor layer providing a major surface facing the first semiconductor layer. In one aspect, the movable body includes a pivoting proof mass of a teeter-totter accelerometer; a travel stop feature, configured to contact the first semiconductor layer to prevent over rotation of the pivoting proof mass, and including a portion of the major surface facing the first semiconductor layer. In another aspect, the first semiconductor layer comprises one of silicon or germanium. In a further aspect, the second semiconductor layer includes one of silicon or germanium. In another aspect, the MEMS device includes at least a portion of an accelerometer.

In yet another embodiment, a method for manufacturing a microelectromechanical systems (MEMS) device includes forming an insulating layer over a substrate; depositing a first semiconductor layer on the insulating layer by reacting a semiconductor-containing gas, gaseous hydrochloric acid, and hydrogen for a first duration of time at a first temperature, wherein, during the deposition, the gaseous hydrochloric acid is at least 15% of a total flow of the gaseous hydrochloric acid and the semiconductor-containing gas; etching the first semiconductor layer using gaseous hydrochloric acid and hydrogen for a second duration of time at a second temperature; depositing a second semiconductor layer over the etched first polysilicon layer by reacting the semiconductor-containing gas and hydrogen for a third duration of time at a third temperature; and patterning the second semiconductor layer and the first semiconductor layer to form a travel stop region of the MEMS device. In one aspect, after the etching the first semiconductor layer and prior to depositing the second semiconductor layer, the method further includes depositing a third semiconductor layer on the etched first semiconductor layer by reacting the semiconductor-containing gas, gaseous hydrochloric acid, and hydrogen for a fourth duration of time at a fourth temperature, wherein, during the deposition of the third polysilicon layer, the gaseous hydrochloric acid is at least 15% of a total flow of the gaseous hydrochloric acid and the semiconductor-containing gas; and etching the third semiconductor layer using gaseous hydrochloric acid and hydrogen for a fifth duration of time at a fifth temperature, wherein the second semiconductor layer is deposited over the etched third semiconductor layer. In another aspect, the depositing the third semiconductor layer is performed by also reacting a dopant gas. In another aspect, the semiconductor-containing gas includes one of silicon or germanium.

What is claimed is:

1. A method for manufacturing a microelectromechanical systems (MEMS) device, the method comprising:
    forming an insulating layer over a substrate;
    depositing a first polysilicon layer on the insulating layer by reacting a silicon-containing gas, gaseous hydrochloric acid, and hydrogen for a first duration of time at a first temperature, wherein, during the deposition, the gaseous hydrochloric acid is at least 15% of a total flow of the gaseous hydrochloric acid and the silicon-containing gas;
    etching the first polysilicon layer using gaseous hydrochloric acid and hydrogen for a second duration of time at a second temperature;
    depositing a second polysilicon layer over the etched first polysilicon layer by reacting the silicon-containing gas and hydrogen for a third duration of time at a third temperature; and
    patterning the second polysilicon layer and the first polysilicon layer to form a travel stop region of the MEMS device.

2. The method of claim 1, further comprising:
    forming a sacrificial layer over the travel stop region; and
    forming a third polysilicon layer on the sacrificial layer.

3. The method of claim 2, further comprising removing the sacrificial layer to separate the third polysilicon layer from the travel stop region.

4. The method of claim 1, wherein after the etching the first polysilicon layer and prior to depositing the second polysilicon layer, the method further comprises:
    depositing a third polysilicon layer on the etched first polysilicon layer by reacting the silicon-containing gas, gaseous hydrochloric acid, and hydrogen for a fourth duration of time at a fourth temperature, wherein, during the deposition of the third polysilicon layer, the gaseous hydrochloric acid is at least 15% of a total flow of the gaseous hydrochloric acid and the silicon-containing gas; and
    etching the third polysilicon layer using gaseous hydrochloric acid and hydrogen for a fifth duration of time at a fifth temperature, wherein the second polysilicon layer is deposited over the etched third polysilicon layer.

5. The method of claim 4, wherein the first duration of time and fourth duration of time is each in a range of 5 to 15 minutes and wherein the first temperature and the fifth temperature is each at least 630 degrees Celsius.

6. The method of claim 4, wherein the depositing the third polysilicon layer is performed by also reacting a dopant gas.

7. The method of claim 1, wherein the first duration of time is in a range of 5 to 15 minutes and wherein the first temperature is at least 630 degrees Celsius.

8. The method of claim 7, wherein the depositing the first polysilicon layer is performed by also reacting a dopant gas.

9. The method of claim 7, wherein the second duration of time is in a range of 10 to 40 seconds and the second temperature is at least 950 degrees Celsius.

10. The method of claim 1, wherein the deposited first polysilicon layer has a mean thickness of 40 nm with a tallest peak of at least 55nm and a lowest valley of at most 35 nm.

11. The method of claim 10, wherein the travel stop region has a mean thickness of 350 nm with a tallest peak of at least 420 nm and a lowest valley of at most 300 nm.

12. A method for manufacturing a microelectromechanical systems (MEMS) device, the method comprising:
    forming an insulating layer over a substrate;
    depositing a first semiconductor layer on the insulating layer by reacting a semiconductor-containing gas, gaseous hydrochloric acid, and hydrogen for a first duration of time at a first temperature, wherein, during the deposition, the gaseous hydrochloric acid is at least 15% of a total flow of the gaseous hydrochloric acid and the semiconductor-containing gas;

etching the first semiconductor layer using gaseous hydrochloric acid and hydrogen for a second duration of time at a second temperature;

depositing a second semiconductor layer over the etched first polysilicon layer by reacting the semiconductor-containing gas and hydrogen for a third duration of time at a third temperature; and patterning the second semiconductor layer and the first semiconductor layer to form a travel stop region of the MEMS device.

13. The method of claim 12, wherein after the etching the first semiconductor layer and prior to depositing the second semiconductor layer, the method further comprises:

depositing a third semiconductor layer on the etched first semiconductor layer by reacting the semiconductor-containing gas, gaseous hydrochloric acid, and hydrogen for a fourth duration of time at a fourth temperature, wherein, during the deposition of the third polysilicon layer, the gaseous hydrochloric acid is at least 15% of a total flow of the gaseous hydrochloric acid and the semiconductor-containing gas; and etching the third semiconductor layer using gaseous hydrochloric acid and hydrogen for a fifth duration of time at a fifth temperature, wherein the second semiconductor layer is deposited over the etched third semiconductor layer.

14. The method of claim 12, wherein the depositing the third semiconductor layer is performed by also reacting a dopant gas.

15. The method of claim 12, wherein the semiconductor-containing gas comprises one of silicon or germanium.

16. A method of manufacturing a microelectromechanical systems (MEMS) device comprising:

forming a fixed surface comprising
a first semiconductor layer over a substrate, wherein the first semiconductor layer has a mean thickness of 350 nm with a tallest peak of at least 420 nm and a lowest valley of at most 300 nm; and
a first insulating layer over at least a portion of the first semiconductor layer; and forming a movable body comprising a second semiconductor layer providing a major surface facing the first semiconductor layer.

17. The method of claim 16 wherein forming the movable body comprises:

forming a pivoting proof mass of a teeter-totter accelerometer;

forming a travel stop feature, configured to contact the first semiconductor layer to prevent over rotation of the pivoting proof mass, and comprising a portion of the major surface facing the first semiconductor layer.

18. The method of claim 16 wherein the first semiconductor layer comprises one of silicon or germanium.

19. The method of claim 18 wherein the second semiconductor layer comprises one of silicon or germanium.

20. The method of claim 16 wherein the MEMS device comprises at least a portion of an accelerometer.

* * * * *